(12) United States Patent
Bayerer

(10) Patent No.: US 7,462,557 B2
(45) Date of Patent: Dec. 9, 2008

(54) SEMICONDUCTOR COMPONENT AND METHOD FOR CONTRACTING SAID SEMICONDUCTOR COMPONENT

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/563,343

(22) Filed: Nov. 27, 2006

(65) Prior Publication Data

US 2007/0087553 A1 Apr. 19, 2007

Related U.S. Application Data

(60) Division of application No. 10/842,066, filed on May 10, 2004, now Pat. No. 7,151,318, which is a continuation of application No. PCT/EP02/12660, filed on Nov. 12, 2002.

(30) Foreign Application Priority Data

Nov. 16, 2001 (DE) ................ 101 56 468

(51) Int. Cl.
*H01L 21/44* (2006.01)
(52) U.S. Cl. ................ 438/617; 438/666; 257/E23.024
(58) Field of Classification Search ................ 438/617, 438/666; 257/784, E23.024
See application file for complete search history.

(56) References Cited

U.S. PATENT DOCUMENTS

| 4,374,453 A | * | 2/1983 | Rodriguez | ................ 29/426.5 |
| 5,008,725 A | | 4/1991 | Lidow et al. | ................ 257/341 |
| 5,220,490 A | | 6/1993 | Weigler et al. | ................ 361/777 |
| 5,364,009 A | | 11/1994 | Takahashi et al. | ........ 228/110.1 |
| 5,666,009 A | | 9/1997 | Kumano et al. | ............. 257/784 |
| 5,828,116 A | | 10/1998 | Ao | ............................. 257/417 |
| 5,962,919 A | * | 10/1999 | Liang et al. | ................. 257/748 |
| 5,962,926 A | * | 10/1999 | Torres et al. | ................. 257/786 |
| 6,111,297 A | | 8/2000 | Grimaldi et al. | ............ 257/401 |
| 6,169,330 B1 | * | 1/2001 | Pankove | ..................... 257/782 |

FOREIGN PATENT DOCUMENTS

| DE | 41 35 411 A1 | 4/1993 |
| DE | 196 12 838 A1 | 5/1997 |
| DE | 695 13 680 T2 | 5/2000 |
| EP | 0 788 659 B1 | 12/1999 |

OTHER PUBLICATIONS

Jens Peer Stengl et al.; Leistungs-MOS-FET-Praxis; 2. Auflage, Munchen, Pflaum, 1992.

* cited by examiner

*Primary Examiner*—Nitin Parekh
(74) *Attorney, Agent, or Firm*—Coats & Bennett, P.L.L.C.

(57) ABSTRACT

The semiconductor component has several regularly arranged active cells (1), each comprising at least one main defining line (8). A bonding wire (18, 20) is fixed to at least one bonding surface (14, 16) by bonding with a bonding tool, oscillating in a main oscillation direction (22, 24), for external electrical contacting. The bonding surfaces (14, 16) are of such a size and oriented such that the main oscillation direction (22, 24) runs at an angle ($\alpha$), with a difference of 90° to the main defining line (8).

6 Claims, 2 Drawing Sheets

SEMICONDUCTOR COMPONENT AND METHOD FOR CONTRACTING SAID SEMICONDUCTOR COMPONENT

CROSS REFERENCE TO RELATED APPLICATION

This application is a divisional of U.S. patent application Ser. No. 10/842,066 filed May 10, 2004 now U.S. Pat. No. 7,151,318, which is a continuation of copending International Application No. PCT/EP02/12660 filed Nov. 12, 2002 which designates the United States, and claims priority to German application no. 101 56 468.6 filed Nov. 16, 2001.

TECHNICAL FIELD OF THE INVENTION

The present invention lies in the field of semiconductor electronics, in particular power semiconductors, and relates to a semiconductor component and method for bonding of such a semiconductor component.

BACKGROUND OF THE INVENTION

DE 41 35 411 A1 reveals a semiconductor component having a multiplicity of active cells. The cells may be configured as MOS cells. For the purpose of making external electrical contact, the semiconductor component has contact areas or bonding areas, which are also referred to as bonding pads or pads. The bonding areas are applied as metal layers or metalizations on the top side of the semiconductor component or over the active cells of the semiconductor component. The bonding areas may be composed of aluminum and have a rectangular shape.

Active cells may be present in a strip cell arrangement for example in the case of so-called strip cell IGBTs (Insulated Gate Bipolar Transistor). The active cells may also be patterned two-dimensionally in the X-Y direction by virtue of cells being formed regularly periodically in the X direction and e.g. in the Y direction orthogonal thereto. The active cells have a main longitudinal direction which, in the case of rectangular or elongate cells, essentially runs parallel to a main boundary line of the cell.

During the bonding operation, i.e. the electrically conductive connection of a bonding wire to an assigned bonding area, use is made of a bonding tool with an oscillating head. The oscillating head oscillates in a so-called bonding direction (also referred to as main oscillation direction hereinafter) in order, by virtue of the oscillation energy thus applied, to effect a connection of a region (the so-called bonding base) of a connecting wire (bonding wire) to the bonding area. This operation is also referred to as "ultra-sonic wedge bonding".

DE 41 35 411 A1 says nothing about the orientation of the main oscillation direction (bonding direction) with regard to the main boundary line of the active cell.

SUMMARY OF THE INVENTION

It is an object of the present invention to optimize a semiconductor component and a method for bonding of such a semiconductor component to the effect of minimizing loading on the semiconductor component during the bonding operation.

This object can be achieved according to the invention by a semiconductor component comprising a plurality of regularly arranged active cells, which in each case have at least one main boundary line, and having at least one bonding area, on which at least one bonding wire can be fixed by bonding by means of a bonding tool oscillating in a main oscillation direction, the bonding area being dimensioned and oriented such that the main oscillation direction can be set at an angle that is different from 90° with respect to the main boundary line.

The object can also be achieved by a method for bonding of a semiconductor component comprising a plurality of regularly arranged active cells, which in each case comprise at least one main boundary line, and at least one bonding area, comprising the steps of connecting a bonding wire to the bonding area by bonding in a main oscillation direction, and setting the main oscillation direction at an angle that is different from 90° with respect to the main boundary line.

It can be made possible for the main oscillation direction to be set parallel to the main boundary line. The main boundary line may lie in parallel to an outer edge of the semiconductor component. The active cells can be embodied in strip form. The active cells can be embodied in rhomboid fashion, and the bonding area can be dimensioned and oriented such that the main oscillation direction can be set at an angle that differs from 90° with respect to the large rhombus diagonal. The bonding area can be dimensioned and oriented such that the main oscillation direction can be set parallel to the large rhombus diagonal.

The object can furthermore be achieved by a semiconductor component comprising a plurality of regularly two-dimensionally arranged active cells, which in each case have at least one main boundary line, and comprising at least one bonding area, on which at least one bonding wire can be fixed by bonding by means of a bonding tool oscillating in a main oscillation direction, the bonding area being dimensioned and oriented such that the main oscillation direction can be set at an angle that is different from 90° with respect to the main boundary lines.

The active cells can be embodied in rectangular fashion and being arranged in a manner rotated through 45° relative to a rectangular outer contour of the semiconductor component, and the bonding area can be embodied in rectangular fashion and running with its longer rectangle side parallel to an outer edge of the outer contour. The active cells can be embodied in rhomboid fashion, and the bonding area can be dimensioned and oriented such that the main oscillation direction can be set at an angle that differs from 90° with respect to the large rhombus diagonal. The bonding area can be dimensioned and oriented such that the main oscillation direction can be set parallel to the large rhombus diagonal.

The present invention attends to the problem that the introduction of mechanical energy during the bonding operation can lead to an impairment of or damage to the semiconductor component. The invention is based on the insight that, in the case of a strip-type cell structure or mesh-type cell arrangement, there is a considerable risk of destructions if the main oscillation direction runs in a "critical direction"—i.e. perpendicular or transversely to the extent of the strip cells or transversely to the largest longitudinal extent of the active cells. This is usually the case if the direction of the periodic cell arrangement runs parallel to the edges of the semiconductor component or the semiconductor chip and the (rectangular) bonding areas are also arranged parallel to said edges. During the bonding operation, the orientation of the strip cells or, given a two-dimensional arrangement of active cells, one of the arrangement directions then runs transversely (i.e. at an angle of 90° to the longitudinal direction of the bonding area and thus transversely to the main oscillation direction of the bonding tool.

An essential aspect of the present invention thus consists in optimizing the bonding direction with regard to the orientation of the active cells with the purpose of reduced mechanical loading on the semiconductor component.

The invention ensures that the force component exerted in the main oscillation direction (bonding direction) of the bonding tool does not act completely in the critical—i.e. the right-angled—direction with respect to the main boundary line of the active cell. Every bonding direction that deviates from the critical direction improves the loading situation and thus increases the yield. An angle of 30° between main oscillation direction and main boundary line (e.g. parallel to the longitudinal direction of the strip cell) already brings about a 50% reduction in the force component acting transversely to the main boundary line.

It is particularly preferable, in the case of strip cells, for the main oscillation direction to be located longitudinally with respect to the main boundary line of the active cells. The chip or semiconductor component structure is preferably chosen such that the (strip) cells are oriented longitudinally with respect to the longitudinal side of the bonding area. For its part, the bonding area is preferably oriented parallel to an edge of the semiconductor component. This means, then, that the main boundary lines lie parallel to an outer edge of the semiconductor component.

In the case of a mesh-type structure or two-dimensional arrangement of the active cells, there naturally exist two critical directions, which are at right angles to one another e.g. in the case of an orthogonal arrangement of the active cells, but may also form other angles, e.g. 45° in the case of an annular cell arrangement.

According to the invention, in these cases, the bonding area is dimensioned and oriented such that the main oscillation direction can be set at an angle that is different from 90° with respect to the main boundary lines. In the case where the two critical directions run orthogonally, an orientation of the bonding areas and thus of the main oscillation direction of in each case 45° with respect to the two critical directions is particularly preferred.

In order to facilitate this bonding orientation by means of the structure of the semiconductor component, according to a preferred development of the invention, the active cells are embodied in rectangular fashion and are arranged in a manner rotated through 45° relative to a rectangular outer contour of the semiconductor component. In this case, the bonding area is embodied in rectangular fashion and preferably runs with its longer rectangle side parallel to an outer edge of the outer contour.

A further preferred variant of the invention relates to a semiconductor component in which the active cells are arranged in mesh-like fashion not in orthogonal directions with respect to one another, but rather e.g. along axes running at an angle of 45° with respect to one another. This results in a rhomboid elementary cell in the mesh structure. In this case, the main boundary lines of the cells may be oriented at 45° with respect to the outer edge of the semiconductor component and the bonding areas may be oriented along the outer edge. In the case of rhombus shapes having larger angles, too, the cell structure is preferably oriented with a rhombus diagonal parallel to an outer edge of the semiconductor component and the bonding areas are embodied parallel to the larger rhombus diagonal. This makes it possible to achieve an optimum reduction of the bonding forces acting at the critical cell edge (main boundary line).

The method according to the invention for bonding of a semiconductor component having a plurality of regularly arranged active cells, which in each case have at least one main boundary line, and having at least one bonding area, provides for a bonding wire to be connected to the bonding area by bonding in a main oscillation direction, and the main oscillation direction being set at an angle that is different from 90° with respect to the main boundary line.

BRIEF DESCRIPTION OF THE DRAWING

Exemplary embodiments of the invention are explained in more detail below with reference to a drawing, in which, diagrammatically.

DESCRIPTION OF THE INVENTION

Figure 1:
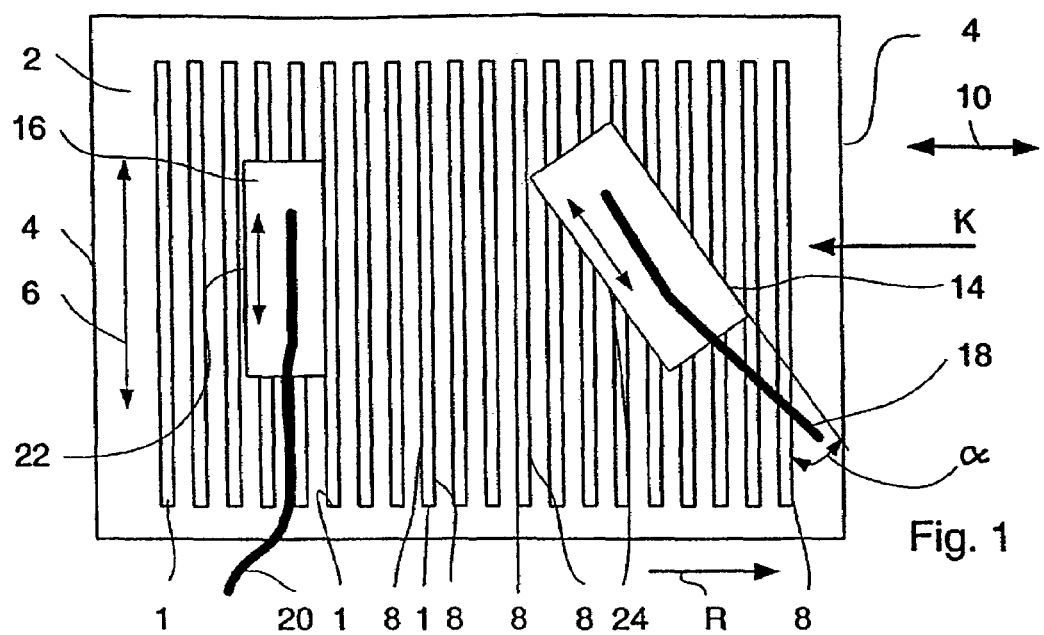
FIG. 1 shows a first exemplary embodiment of a semiconductor component according to the invention in plan view.

The semiconductor component shown in FIG. 1 has a multiplicity of active cells 1 in the form of strip cells which are formed regularly along a repetition direction R. The strip cells 1 are formed in a common semiconductor body 2. The semiconductor body or semiconductor chip has a rectangular shape and outer boundary edges 4. The strip cells 1 have a longitudinal extent in the direction of the double arrow 6 and main boundary lines 8 parallel to the longitudinal extent. With regard to mechanical loading, the main boundary lines 8 are particularly sensitive to force components which act on the strip cells 1 transversely, i.e., in the exemplary embodiment, at right angles to the main boundary lines 8 in the direction of the double arrow ("critical direction") 10.

On the top side 12 of the semiconductor component, provision is made of metallic connecting areas 14, 16 for making electrical contact by means of bonding wires 18, 20. The connecting areas 14, 16 are also referred to as bonding areas or bonding pads. The end regions of the bonding wires are conductively connected to the bonding areas 14, 16 by bonding.

A particularly high mechanical loading on the strip cells 1 results during the bonding operation if the main oscillation direction 22 of the bonding tool runs transversely to the strip cells 1 or transversely to the main boundary lines 8 thereof—i.e. in the "critical direction" 10 of the double arrow. An arrangement of the bonding area 14 at an angle $\alpha$ of 30° with respect to the main boundary line (parallel to the longitudinal direction of the strip cell) already leads to a force component K reduced by 50% in the critical direction 10. This is because, with Ktot=total force exerted by the bonding tool, said component is dimensioned as $K=K_{tot}*\sin\alpha=K_{tot}*0.5$.

An optimum reduction (to 0 in this example) of the force component that acts transversely to the critical direction results in the case of the orientation chosen for the bonding area 16. In this case, the main extent of the bonding area embodied in rectangular fashion is oriented parallel to the main boundary lines 8. The bonding tool can thus be positioned in such a way that its main oscillation direction 24 lies parallel to the main boundary lines 8 and no force component arises transversely to the main boundary lines 8. In this exemplary embodiment, in terms of production engineering, the main boundary line and thus the main oscillation direction advantageously lie parallel to the outer boundary edge 4 of the semiconductor component.

Figure 2:
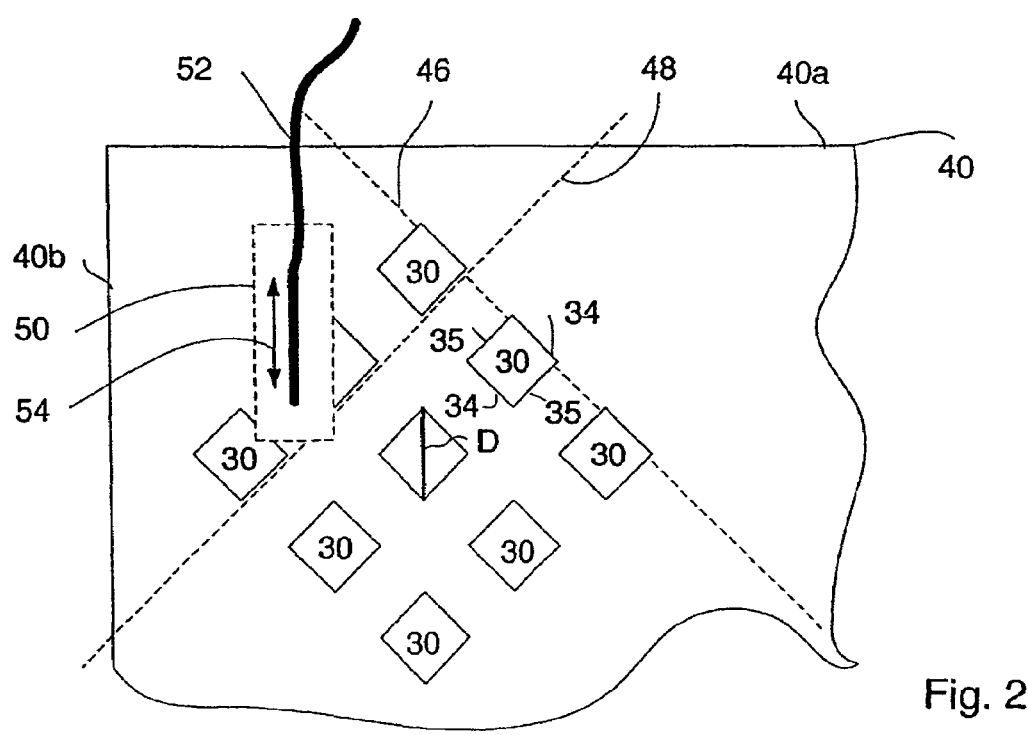
FIG. 2 shows a further exemplary embodiment of a semiconductor component according to the invention in plan view.

FIG. 2 shows a further exemplary embodiment of a semiconductor component according to the invention, in which a multiplicity of active cells 30 having an essentially square basic shape are arranged in a mesh-like grid. The active cells 30 thus in each case have two pairs of main boundary lines 34, 35 running at right angles with respect to one another. In the exemplary embodiment, the active cells 30 are oriented in a manner offset by 45° relative to the outer contour 40 or the outer edges 40a, 40b thereof. This is illustrated by dashed auxiliary lines 46, 48 correspondingly running at an angle of 45° with respect to the edges 40a, 40b. A bonding area 50 is applied on the top side of the semiconductor component. As described above, a bonding wire 52 is electrically conductively connected to said bonding area by bonding for the purpose of bonding of the semiconductor component. The bonding wire 52 has been bonded by means of a bonding tool, the main oscillation direction 54 of which runs in each case at an angle of 45° with respect to the main boundary lines 34, 35 or the auxiliary lines 46, 48. In this exemplary embodiment, too, the orientation of the bonding area 50 enables the bonding forces acting on the main boundary lines of the active cells to be minimized since the bonding forces do not act perpendicularly on any of the main boundary lines, but rather only with the component reduced by the corresponding angle function cos (45°). In the case of this configuration, it is not possible in practice to completely relieve the loading on the main boundary lines, since this would mean full loading on the other main boundary line.

Thus, a uniform distribution of the force components is preferably sought, which is effected according to FIG. 2 by virtue of the fact that the main oscillation direction 54 runs parallel to the edges 40a, 40b and the active cells are embodied in a manner rotated through 45° so that the main oscillation direction 54 is parallel to the respective diagonal D of the rhomboid active cells 30.

Figure 3:
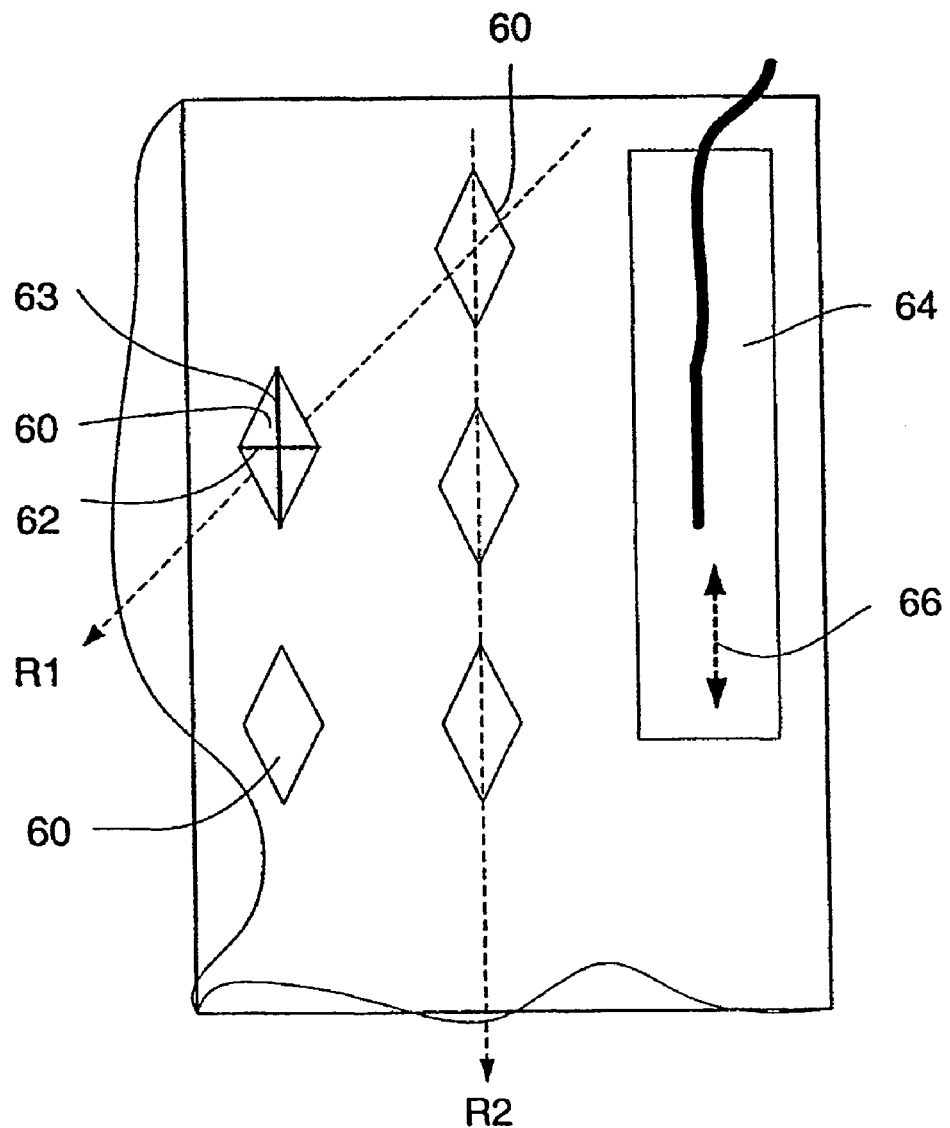
FIG. 3 shows a third exemplary embodiment of a semiconductor component according to the invention in plan view.

FIG. 3 shows a variant of the further exemplary embodiment of a semiconductor component according to the invention as shown in FIG. 2, here a multiplicity of active cells 60 having an essentially rhomboid basic shape being arranged in a mesh-like grid. However, the rhombus shape of these active cells is asymmetrical in so far as the rhombi have different internal angles and thus a small 62 and a large diagonal 63. In this case, a bonding area 64 formed on the top side of the semiconductor component is dimensioned and oriented such that the main oscillation direction 66 of the bonding tool can be set at an angle that is different from 90°—in the optimum case parallel to the large diagonal 63. This configuration and dimensioning rule is advantageous if, as indicated by auxiliary lines in FIG. 3, the active cells are not arranged in a right-angled grid or mesh, but rather e.g. along two directions R1, R2 which form an angle of e.g. 45°.

I claim:

1. A method for bonding of a semiconductor component using a bonding tool, the semiconductor component comprising a plurality of regularly arranged active cells each having at least one main boundary line, and at least one bonding area in electrical contact with at least one of the active cells, comprising the steps of:

connecting a bonding wire to the bonding area by bonding in a main oscillation direction, and setting the main oscillation direction of the bonding tool at an angle that is different from 90° with respect to the main boundary line.

2. The method as claimed in claim 1, wherein the main oscillation direction is set parallel to the main boundary line.

3. The method as claimed in claim 1, wherein the main boundary line lies parallel to an outer edge of the semiconductor component.

4. The method as claimed in claim 1, wherein the active cells are embodied in strip form.

5. The method as claimed in claim 1, wherein the active cells are embodied in rhomboid fashion, and the bonding area is dimensioned and oriented such that the main oscillation direction is set at an angle that differs from 90° with respect to the large rhombus diagonal.

6. The method as claimed in claim 5, wherein the bonding area is dimensioned and oriented such that the main oscillation direction is set parallel to the large rhombus diagonal.

* * * * *